United States Patent [19]

González

[11] Patent Number: 5,208,180

[45] Date of Patent: May 4, 1993

[54] METHOD OF FORMING A CAPACITOR

[75] Inventor: Fernando González, Boise, Id.

[73] Assignee: Micron Technology, Inc., Boise, Id.

[21] Appl. No.: 846,215

[22] Filed: Mar. 4, 1992

[51] Int. Cl.$^5$ ............................................. H01L 21/70
[52] U.S. Cl. ....................................... 437/60; 437/47;
437/48; 437/52; 437/919; 437/981
[58] Field of Search ................. 437/47, 48, 52, 60,
437/228, 233, 235, 919, 981; 257/308

[56] References Cited

U.S. PATENT DOCUMENTS 4,742,018  3/1988  Kimura et al. ................. 437/48
4,970,564  11/1990  Kimura et al. ................. 357/23.6

Primary Examiner—Tom Thomas
Attorney, Agent, or Firm—Wells, St. John, Roberts, Gregory & Matkin

[57] ABSTRACT

A method of forming a capacitor on a semiconductor wafer includes: a) providing a layer of insulating dielectric; b) providing a mask with an aperture of a selected diameter over the dielectric for definition of a contact opening to a defined area on the wafer; c) isotropically etching the insulating dielectric through the aperture to a selected depth which is less than the dielectric thickness, thereby defining a first contact opening of a selected diameter having non-perpendicular angled ramps; d) anisotropically etching the insulating dielectric through the aperture and first contact opening to the defined area on the wafer thereby defining a second contact opening which extends to the defined area on the wafer; e) depositing a non-conformal layer of polysilicon atop the wafer which is thicker atop the dielectric layer than within the second contact opening, and is thickest over the angled ramps; f) selectively masking polysilicon within the first and second contact openings for definition of a capacitor storage node; g) anisotropically etching the masked polysilicon layer to leave polysilicon atop the non-perpendicular angled ramp portions to provide non-perpendicularly angled projecting polysilicon portions; h) providing a layer of cell dielectric atop the wafer and over polysilicon remaining in the first and second contact openings; and i) providing a layer of conductive material atop the cell dielectric layer.

29 Claims, 15 Drawing Sheets

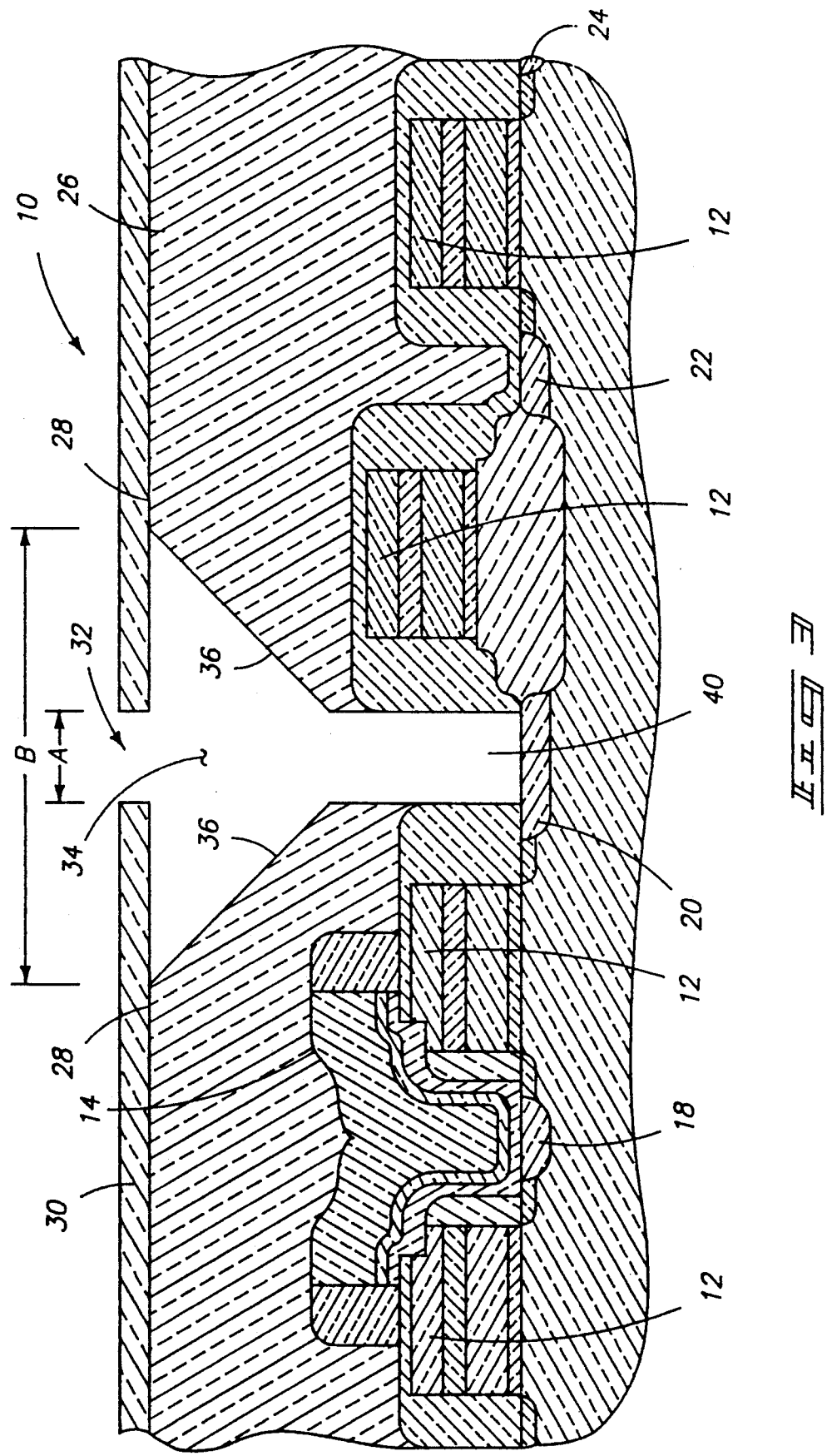

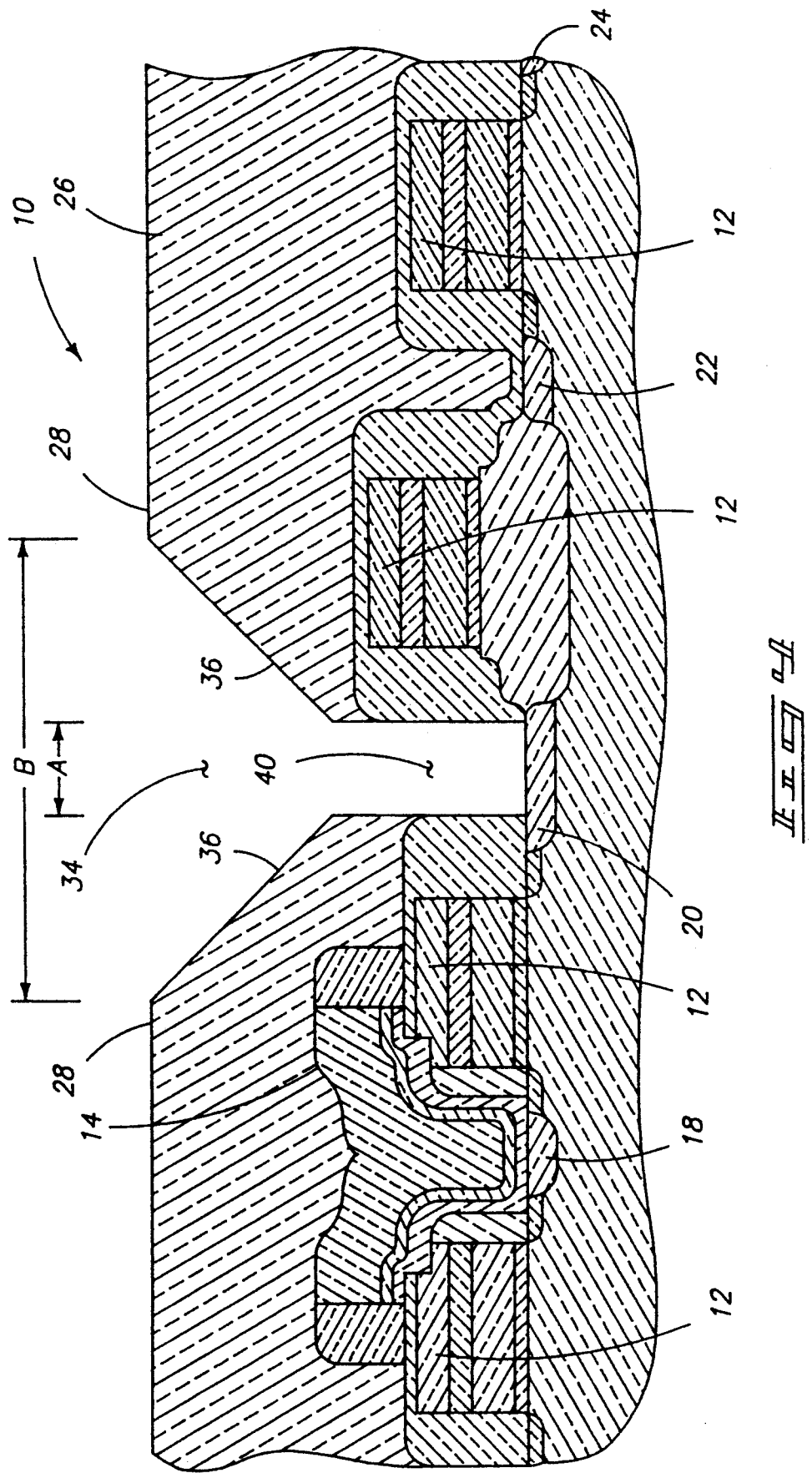

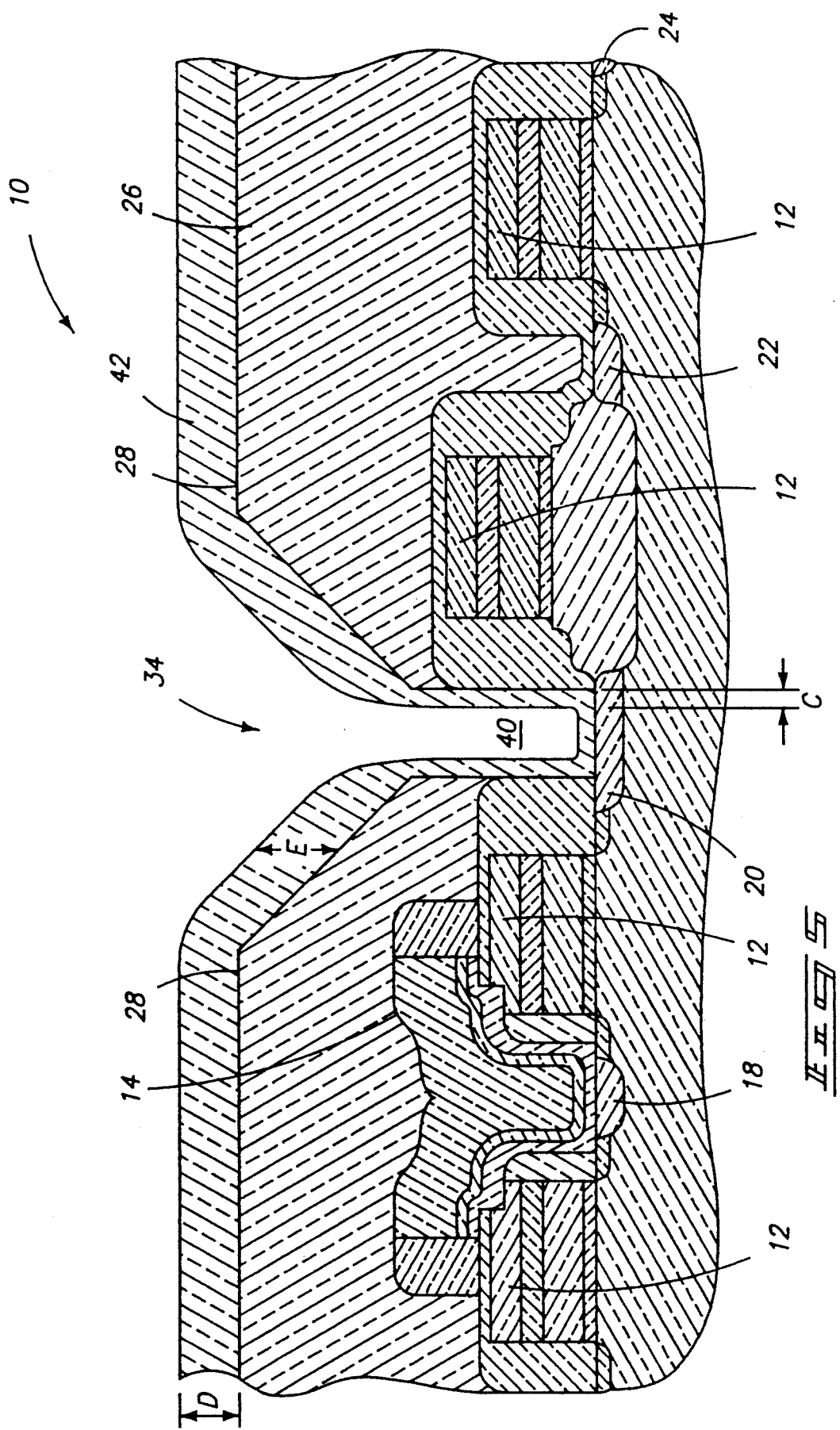

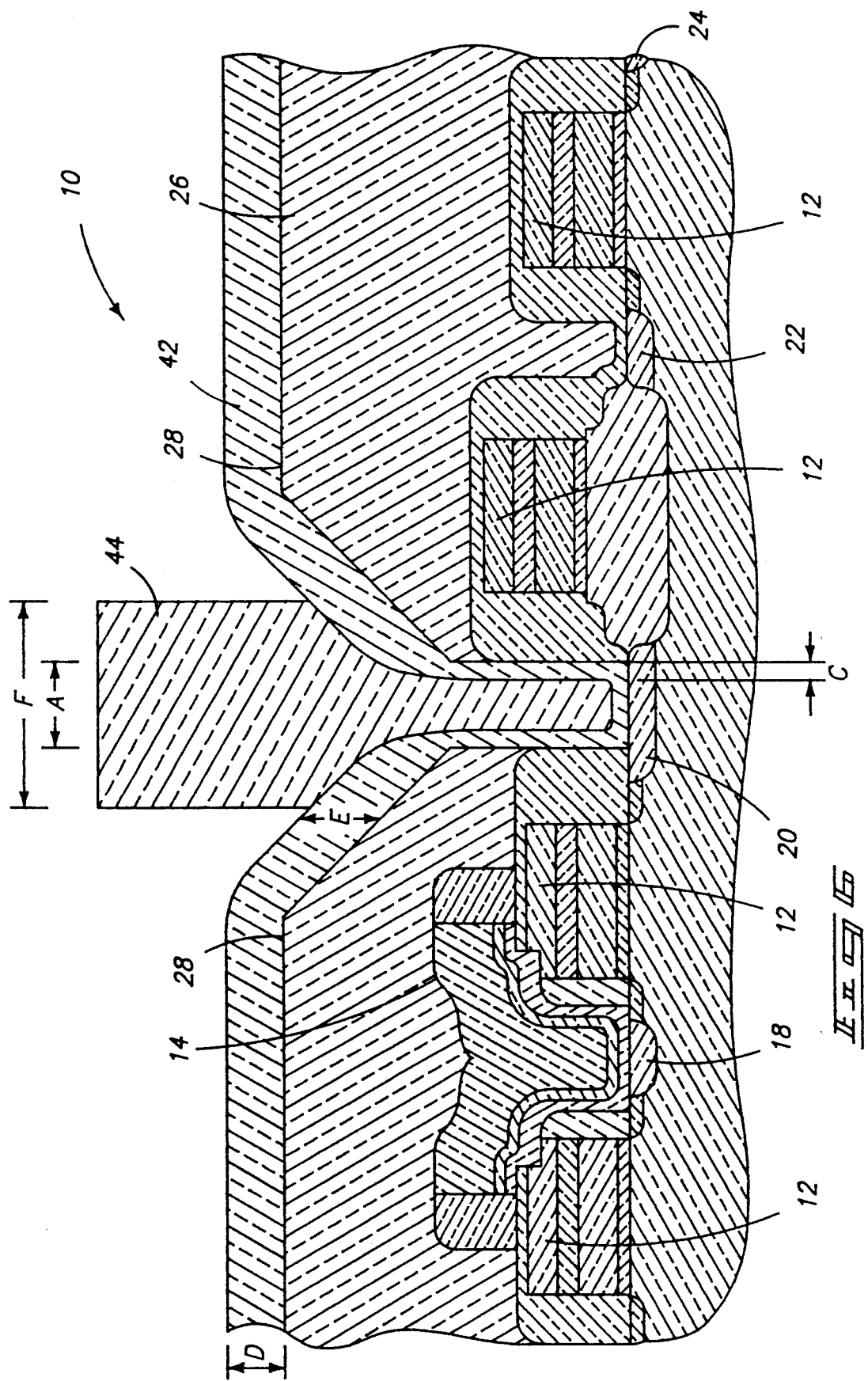

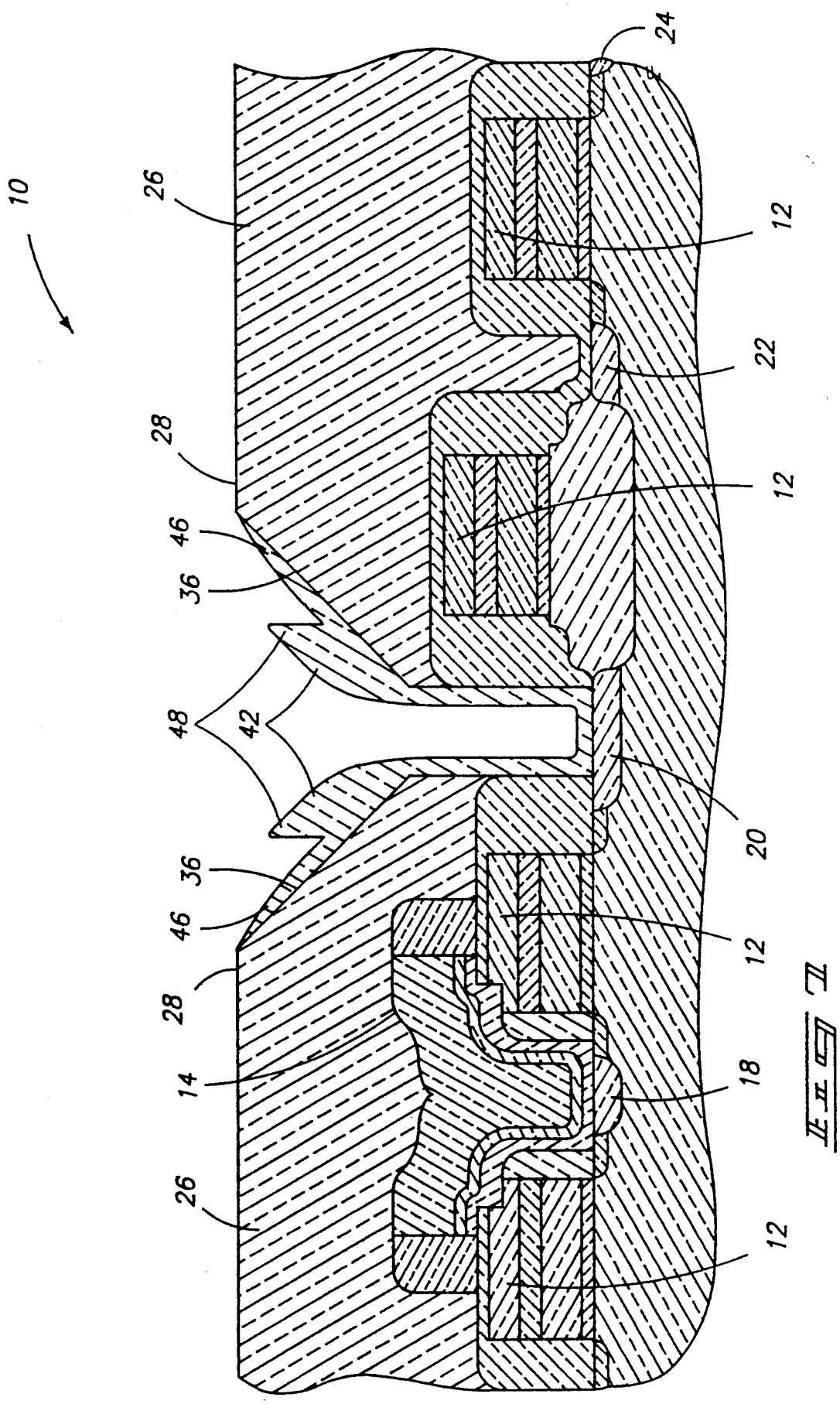

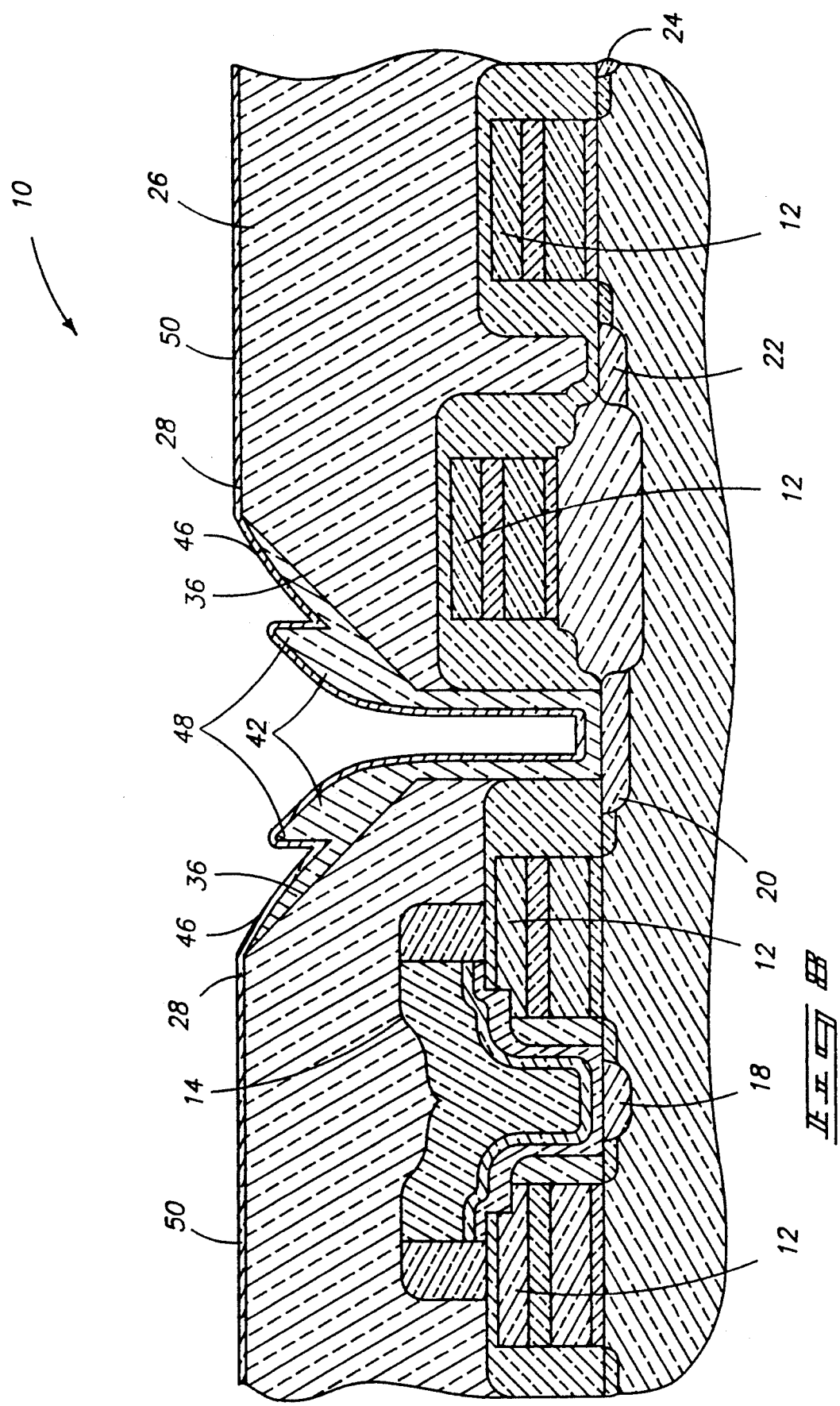

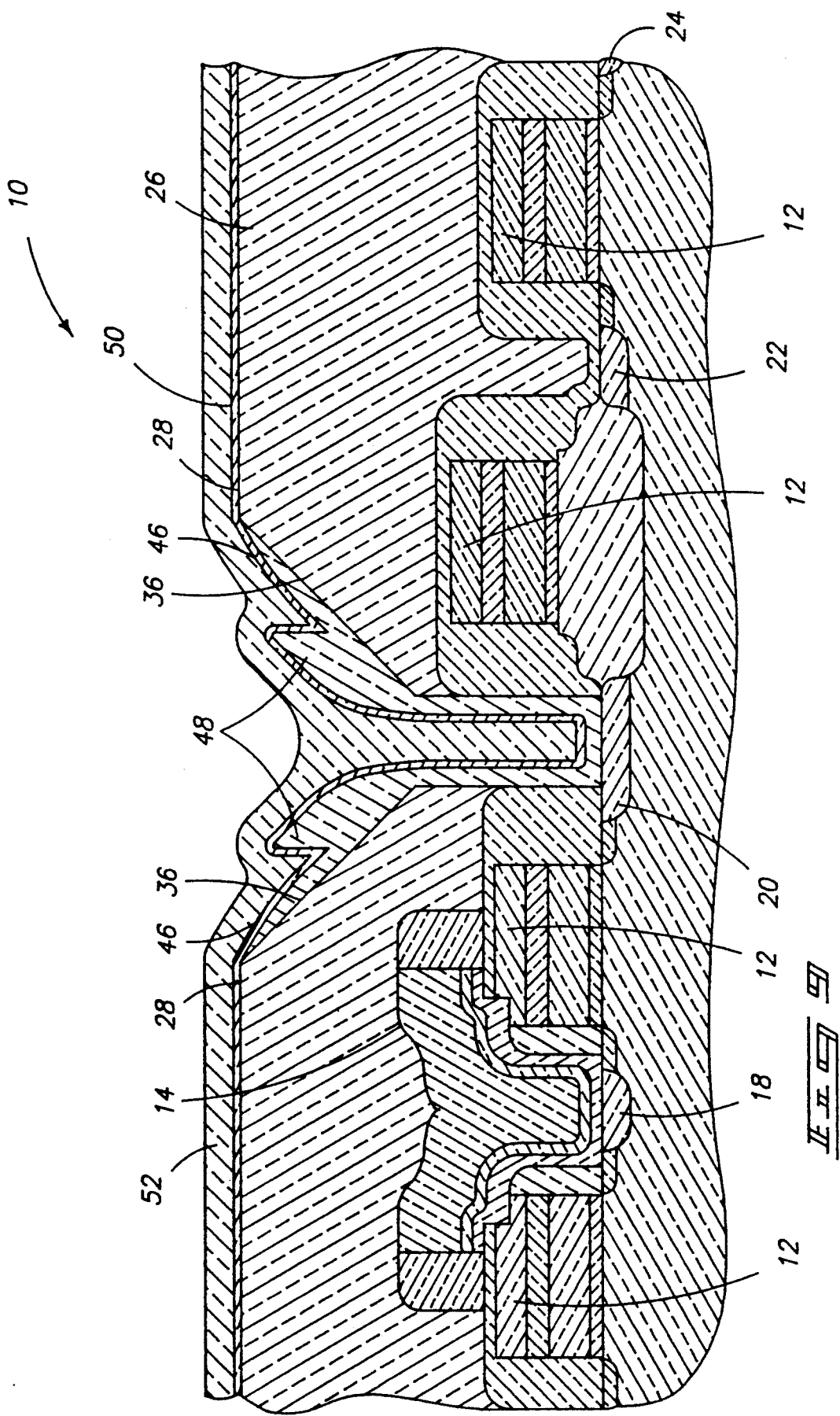

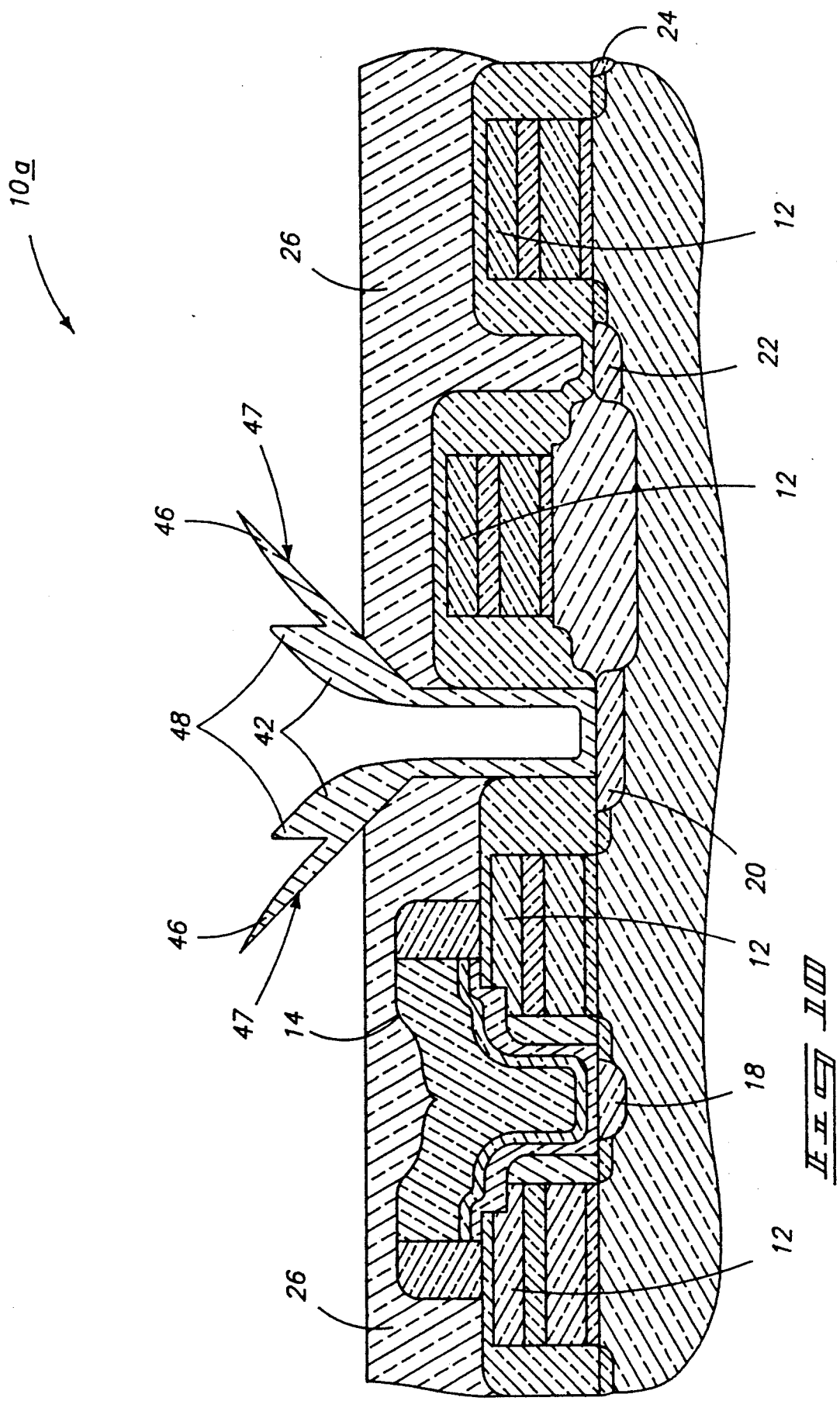

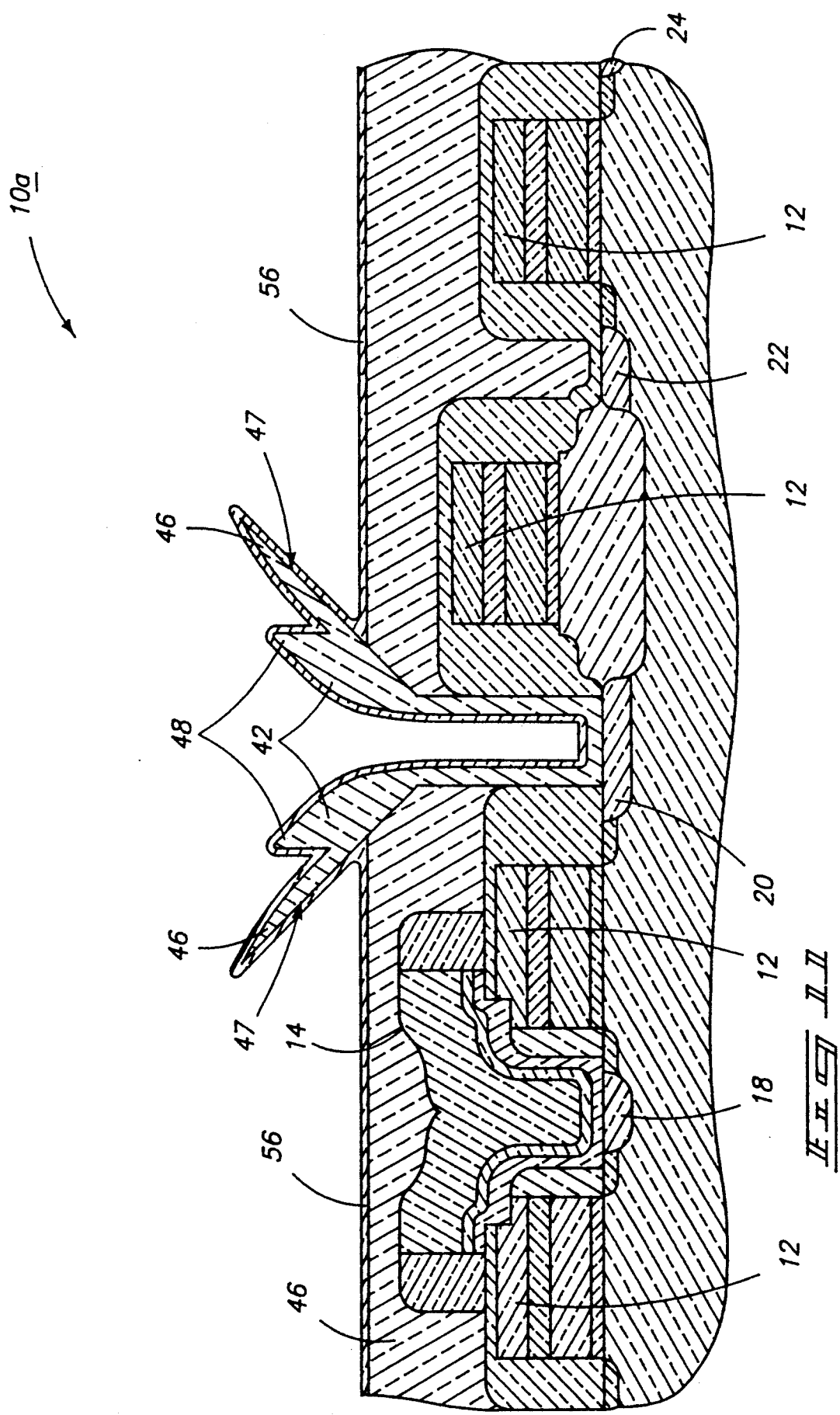

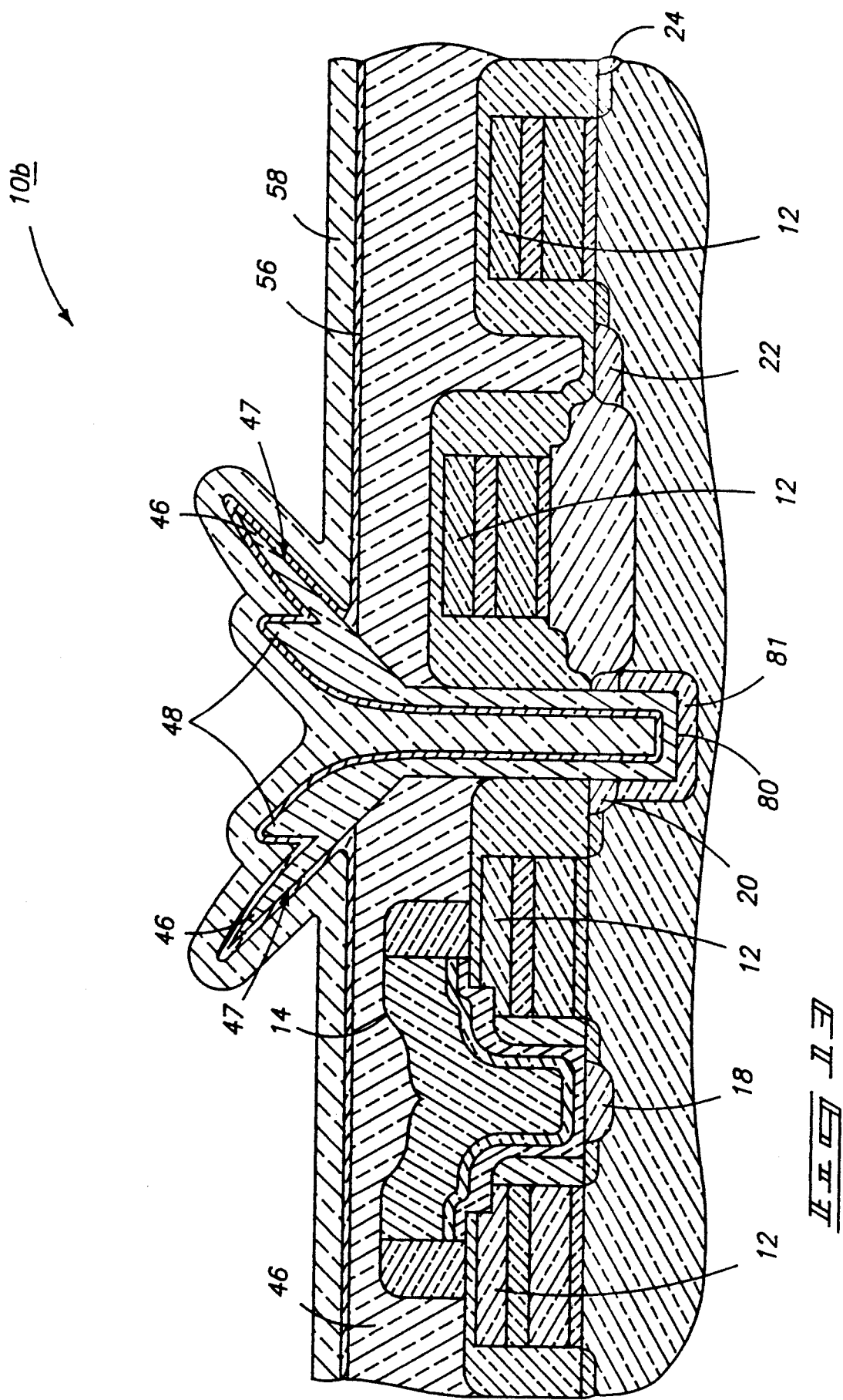

METHOD OF FORMING A CAPACITOR

TECHNICAL FIELD

This invention relates generally to capacitor formation.

BACKGROUND OF THE INVENTION

As DRAMs increase in memory cell density, there is a continuing challenge to maintain a sufficiently high storage capacitance despite decreasing cell area. A principal way of increasing cell density is through cell structure techniques. Such techniques include three dimensional cell capacitors such as trenched or stacked capacitors.

With a conventional stacked capacitor, the capacitor is formed immediately above and electrically connected to the active device area of the associated MOS transistor of the memory cell. Example capacitor constructions are shown by T. Ema et al., "3-Dimensional Stacked Capacitor Cell For 16M And 64M DRAMs", IEDM Tech Digest, pp. 592-595, 1988; S. Inoue et al. "A Spread Stack Capacitor (SSC) Cell For 64M Bit DRAMS", IEDM Tech Digest, pp. 31-34, 1989; and U.S. Pat. No. 5,061,650 to Dennison et al. and references cited therein.

It would be desirable to improve upon these and other processes in providing three dimensional stacked capacitors which maximize capacitance.

BRIEF DESCRIPTION OF THE DRAWINGS

Preferred embodiments of the invention are described below with reference to the following accompanying drawings.

FIG. 3 is a diagrammatic section of the FIG. 1 wafer at a processing step subsequent to that illustrated by FIG. 2.

FIG. 4 is a diagrammatic section of the FIG. 1 wafer at a processing step subsequent to that illustrated by FIG. 3.

FIG. 5 is a diagrammatic section of the FIG. 1 wafer at a processing step subsequent to that illustrated by FIGS. 4 and 4A.

FIG. 6 is a diagrammatic section of the FIG. 1 wafer at a processing step subsequent to that illustrated by FIG. 5.

FIG. 7 is a diagrammatic section of the FIG. 1 wafer at a processing step subsequent to that illustrated by FIG. 6.

FIG. 8 is a diagrammatic section of the FIG. 1 wafer at a processing step subsequent to that illustrated by FIGS. 7 and 7A.

FIG. 9 is a diagrammatic section of the FIG. 1 wafer at a processing step subsequent to that illustrated by FIG. 8.

FIG. 10 is a diagrammatic section of the FIG. 1 wafer at an alternate processing step subsequent to that shown by FIGS. 7 and 7A.

FIG. 11 is a diagrammatic section of the FIG. 10 wafer illustrated at a processing step subsequent to that shown by FIG. 10.

FIG. 13 is a diagrammatic section of an alternately processed semiconductor wafer fragment in accordance with the invention.

SUMMARY OF THE INVENTION

This disclosure of the invention is submitted in furtherance of the constitutional purposes of the U.S. Patent Laws "to promote the progress of science and useful arts" (Article 1, Section 8).

In accordance with the invention, a method of forming a capacitor on a semiconductor wafer comprises the following steps:

providing a layer of insulating dielectric atop the semiconductor wafer to a selected thickness, the insulating layer having an upper surface;

providing a mask layer over the layer of insulating dielectric;

patterning an aperture of a selected diameter through the mask layer for definition of a contact opening through the insulating dielectric layer to a defined area on the wafer;

isotropically etching the insulating dielectric through the aperture to a selected depth which is less than the selected thickness and thereby defining a first contact opening of a selected diameter having non-perpendicular angled ramps extending partially into the layer of insulating dielectric which define a first contact opening base, the selected diameter of the first contact opening at the upper insulating dielectric layer surface being greater than the aperture selected diameter;

anisotropically etching the insulating dielectric through the aperture and first contact opening to the defined area on the wafer thereby defining a second contact opening of a selected diameter extending from the first contact opening base to the defined area on the wafer, the second contact opening diameter being substantially equal to the selected diameter of the aperture;

non-conformally depositing a layer of polysilicon atop the wafer and to within the first and second contact openings, the non-conformal layer incompletely filling the second contact opening and having a first thickness therein, the non-conformal layer having a second thickness over the insulating dielectric layer upper surface which is greater than the first thickness, the non-conformal layer having a third thickness over at least a portion of the angled ramps which is greater than the first and second thickness;

selectively masking polysilicon within the first and second contact openings for definition of a capacitor storage node;

anisotropically etching the masked polysilicon layer to substantially completely remove polysilicon from atop the upper surface of the insulating dielectric and to leave polysilicon atop the non-perpendicular angled ramp portions to provide non-perpendicularly angled projecting polysilicon portions;

providing a layer of cell dielectric atop the wafer and over polysilicon remaining in the first and second contact openings; and providing a layer of conductive material atop the cell dielectric layer.

DETAILED DESCRIPTION OF THE PREFERRED EMBODIMENTS

Figure 1:
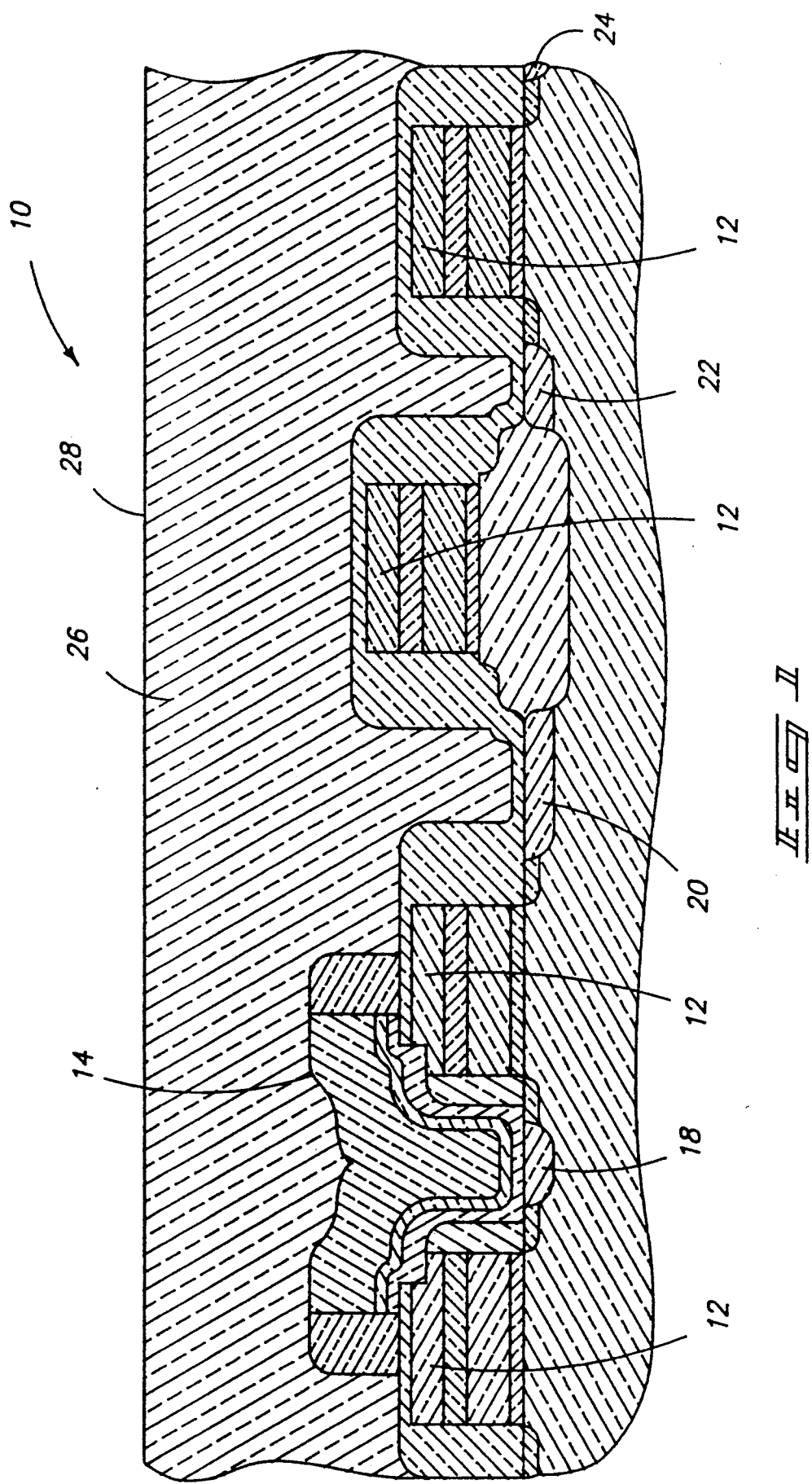
FIG. 1 is a diagrammatic section of a semiconductor wafer at a processing step in accordance with the invention.

More particularly and with reference to the figures, FIG. 1 illustrates a semiconductor wafer fragment 10 having word lines 12, one illustrated digit line 14, and a series of active areas 18, 20, 22 and 24. Word lines 12 are of a conventional construction having a lowermost gate oxide, a lower polysilicon layer, an overlying silicide such as tungsten silicide, and an oxide cap. The illustrated cross section has been taken on a diagonal cut through the array.

A layer 26 of insulating dielectric, preferably borophosphosilicate glass (BPSG), is provided atop the wafer to a selected thickness. Such thickness is preferably from about 12,000 Angstroms to about 18,000 Angstroms, with 15,000 Angstroms being most preferred. Insulating layer 26 is preferably planarized, having an upper planer surface 28.

Figure 2:
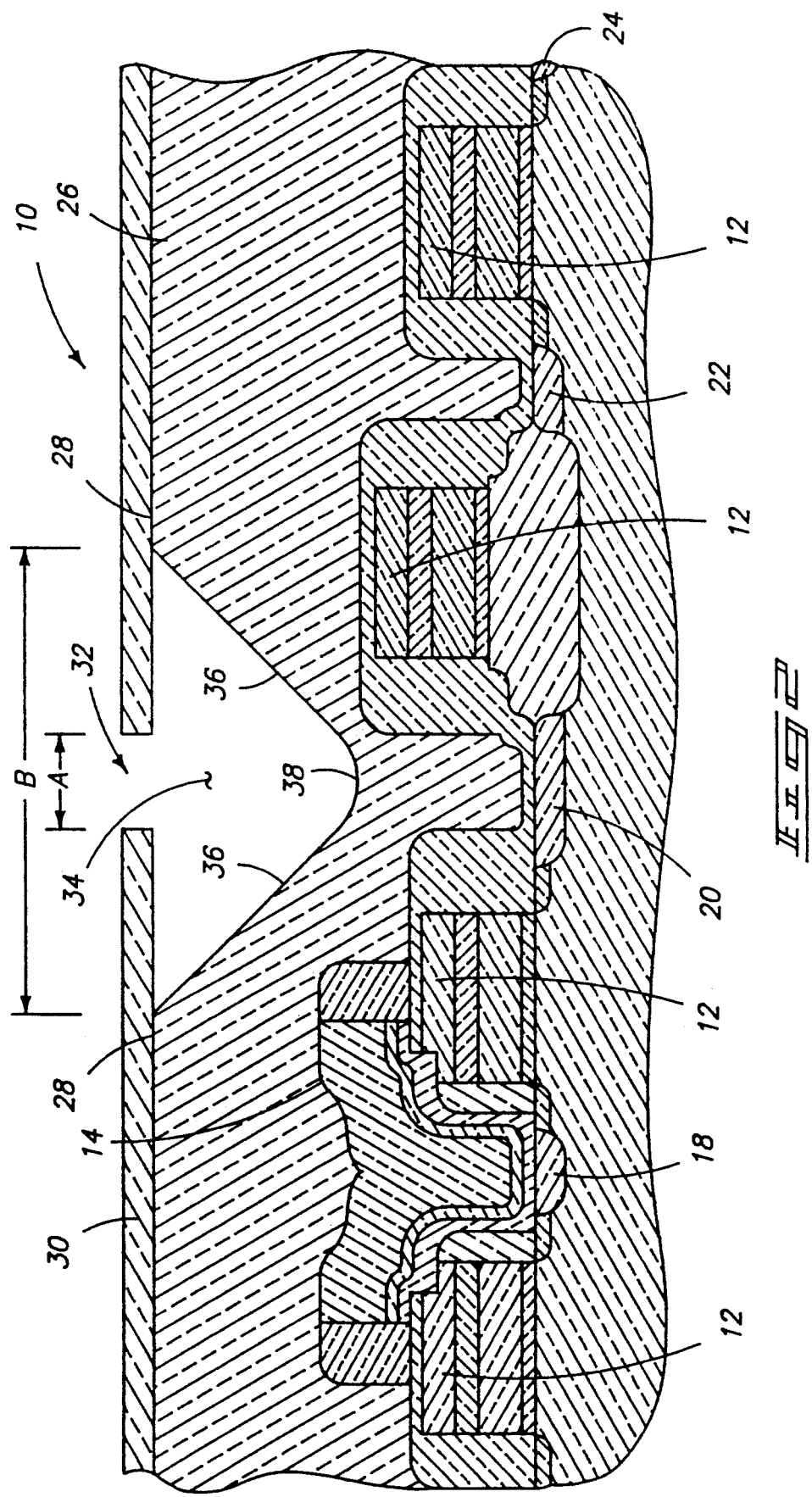
FIG. 2 is a diagrammatic section of the FIG. 1 wafer at a processing step subsequent to that illustrated by FIG. 1.

Referring to FIG. 2, a mask layer 30 (preferably photoresist) is applied over insulating dielectric layer 26. An aperture 32 of a selected diameter "A" is patterned through mask layer 30 for definition of a contact opening through insulating dielectric layer 26 to a defined area, such as active area 20 on wafer 10. Selected diameter "A" of aperture 32 will most preferably be approximately 0.8 micron. Wafer 10 is then subjected to an isotropic etch for etching insulating dielectric material 26 through aperture 32 to a selected depth which is less than the selected thickness of layer 26, thereby defining a first contact opening 34 of a selected diameter "B". Such an etch will produce the illustrated profile, having non-perpendicular angled ramps 36 which extend partially into layer 26 downwardly to define a first contact opening base 38. The selected depth is preferably from about 6,000 Angstroms to about 8,000 Angstroms from upper surface 28. As well, selected diameter "B" of first contact opening 34 at upper insulating dielectric layer surface 28 will be greater than aperture selected diameter "A", with first contact opening diameter "B" preferably being greater than twice aperture selected diameter "A". An example dimension is 2 microns. An example wet isotropic etch chemistry for producing opening 34 with ramp side walls 36 is a buffered HF solution, such as 7:1 $H_2O$:HF by volume.

Referring to FIG. 3, insulating dielectric layer 26 is further etched (but isotropically) through aperture 32 with photoresist mask 30 still in place, and through first contact opening 34 downwardly to defined area 20 on the wafer. This thereby defines a second contact opening 40 of a selected diameter which extends from what was first contact opening base 38 to area 20 on the wafer. As the etch was conducted anisotropically through aperture 32, second contact opening 40's diameter is substantially equal to the selected diameter "A" of aperture 32. An example etch which would produce such an effect would be a reactive ion etch chemistry employing $CHF_3$ and $CH_4$.

Figure 4A:
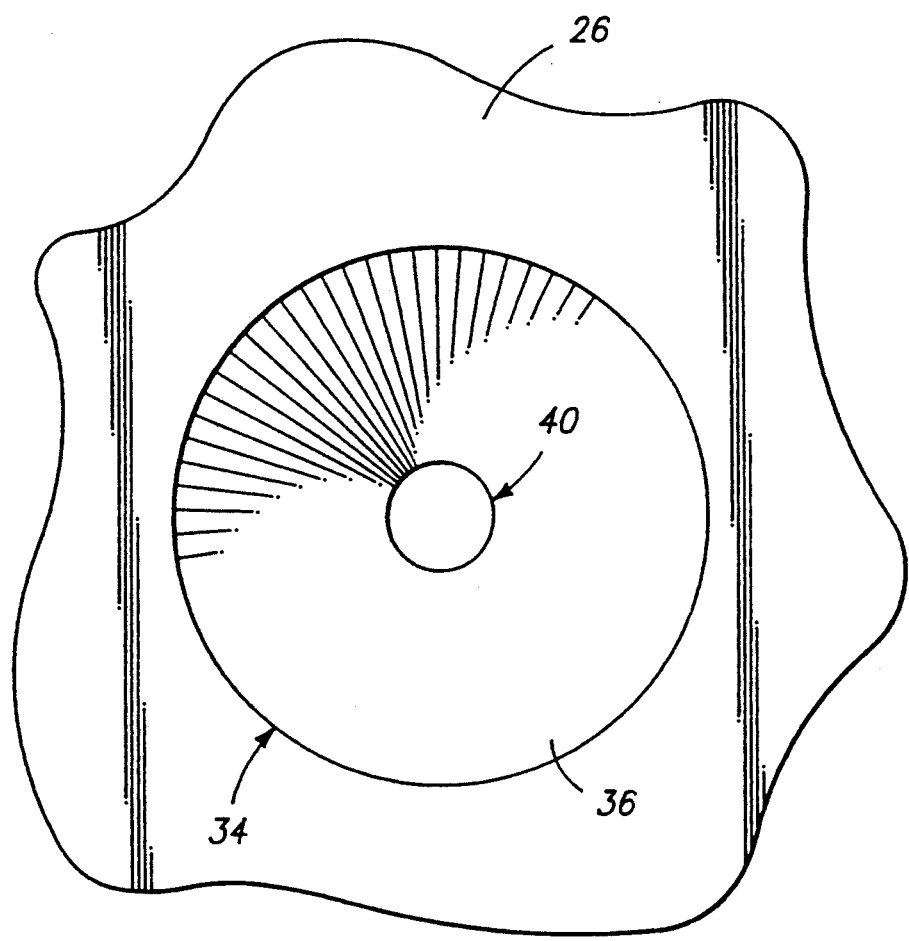
FIG. 4A is a top view of the subject wafer as illustrated in FIG. 4.

Referring to FIG. 4, the mask layer 30 is then removed. FIG. 4A illustrates a top view of the composite contacts 34 and 40. Note that the shape of contacts 34 and 40 could be other than circular, such as elliptical, rectangular, etc.

Referring to FIG. 5, a non-conformal layer 42 of polysilicon is applied atop the wafer and to within first and second contact openings 34, 40 respectively. Non-conformal layer 42 incompletely fills second contact opening 40 and has a first thickness "C" therein. Non-conformal layer 42 has a second thickness "D" over insulating dielectric layer upper surface 28 which is greater than first thickness "C". Non-conformal layer 42 has a third thickness along a vertical line "E" over at least a portion of angled ramps 36 which is greater than first thickness "C" and second thickness "D". Large ratios of second thickness "D" to first thickness "C" are most preferred, with a ratio range of about 5:2 to about 5:1 expected to be typical. In the described embodiment, thickness "D" is 10,000 Angstroms and thickness "C" is 3,000 Angstroms, providing a second to first thickness ratio of 10:3, while thickness "E" is approximately 13,000 to 14,000 Angstroms. Techniques for applying such non-conformal layers of polysilicon involve low pressure chemical vapor deposition (LPCVD) systems, using low gas pressures employing $SiH_4$ as well as very high temperatures. An example recipe would include 550° C., 150 mTorr, $SiH_4$ and phosphine or arsine gas, which would in situ conductively dope the polysilicon.

Referring to FIG. 6, polysilicon layer 42 is selectively masked over first and second contact openings 34, 40 respectively for definition of a capacitor storage node. FIG. 6 illustrates a photoresist mask 44 which is substantially centered over second contact opening 40 having a diameter "F" which is greater than selected diameter "A" of second contact opening 40.

Referring to FIG. 7, polysilicon layer 42 is anisotropically etched (such as by an RIE etch) to substantially completely remove polysilicon from atop upper surface 28 of insulating dielectric layer 26 and to leave polysilicon atop non-perpendicular angled ramp portions 36 to provide non-perpendicularly angled projecting polysilicon portions 46. Because the anisotropic etch only etches in a vertical direction and the polysilicon is etched at an angle along ramps 36, thin polysilicon projections 46 will remain. Photoresist mask 44 is thereafter removed.

Figure 7A:
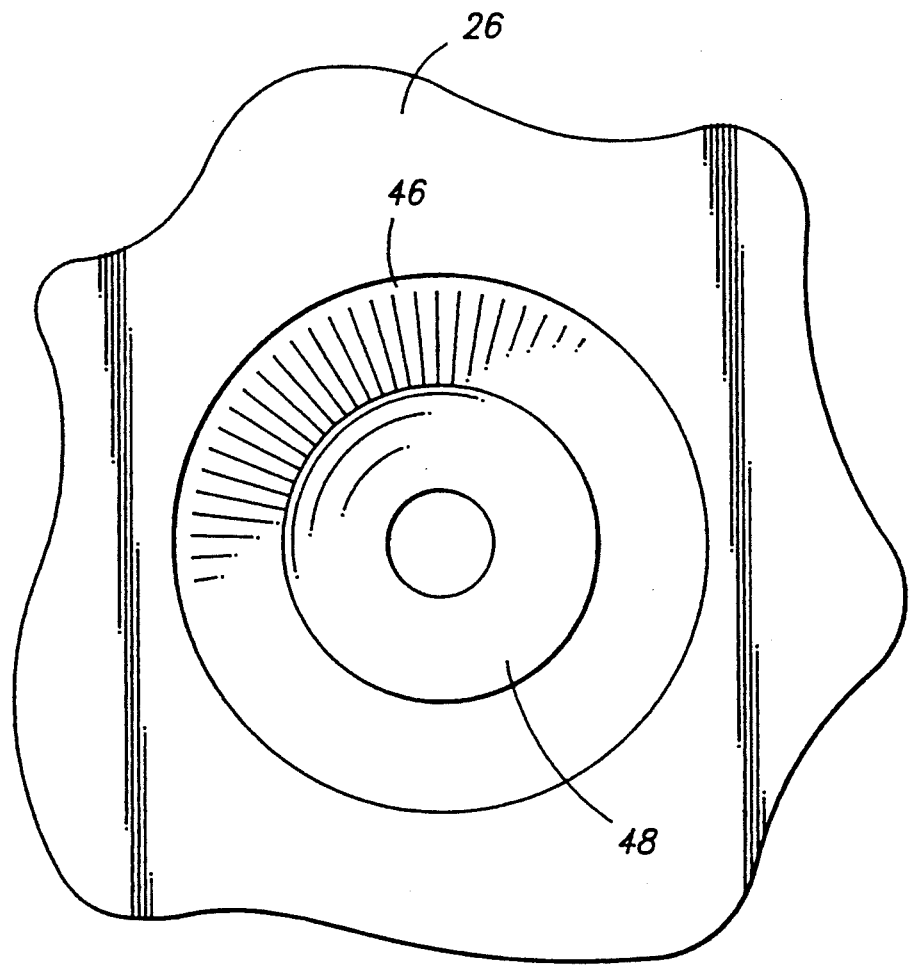
FIG. 7A is a top view of the subject wafer as illustrated in FIG. 7

Referring to FIG. 7A, such will produce a circular, hollow, generally vertically upward extending column 48, adjoined with a circular outwardly flaring angled portions 46. An example etch to produce such a construction would include a $CH_4$ RIE for polysilicon.

Referring to FIG. 8, a layer 50 of cell dielectric, such as $Si_3N_4$, is deposited atop the wafer and over the polysilicon remaining within first and second contact openings 34, 40 respectively. Next, a conventional wet anneal is conducted on nitride layer 50 to seal any pinholes in the nitride which have formed, and to form an ONO construction for dielectric layer 50. An example wet anneal process would include an oxidation cycle that is an OH environment that is generated by combining pure oxygen gas and pure hydrogen gas at elevated temperature.

Referring to FIG. 9, a layer 52 of cell polysilicon is applied atop dielectric layer 50, which would thereafter or in situ be conductively doped.

In accordance with the invention, the various polysilicon layers could also be roughened to provide texturization and further increase in capacitance. Also although the technique has been described with reference to a buried bit line construction, it could as well be utilized for the metal one layers of non-buried bit line DRAM cells, as will be appreciated by those skilled in the art. The above described construction increases capacitance over conventional straight oxide walled capacitors by 76%.

Such a method could further be modified to further maximize capacitance in a wafer 10A, such as is described with reference to FIGS. 10–12. FIG. 10 takes the wafer as processed through FIGS. 7 and 7A, and further isotropically etches insulating dielectric layer 26 downwardly further, as shown. An example etch chemistry would again utilize a buffered HF solution, such as 7:1 $H_2O$:HF by volume for a period of time sufficient to downwardly etch layer 46 a desired distance. Such a technique provides the added benefit of exposing underside areas 47 of non-perpendicularly angled projecting polysilicon portions 46, rendering such surfaces available for capacitance.

As illustrated in FIG. 11, a subsequent layer of silicon nitride 56 is thereafter conformally deposited as a cell dielectric to deposit over and beneath the polysilicon.

Figure 12:
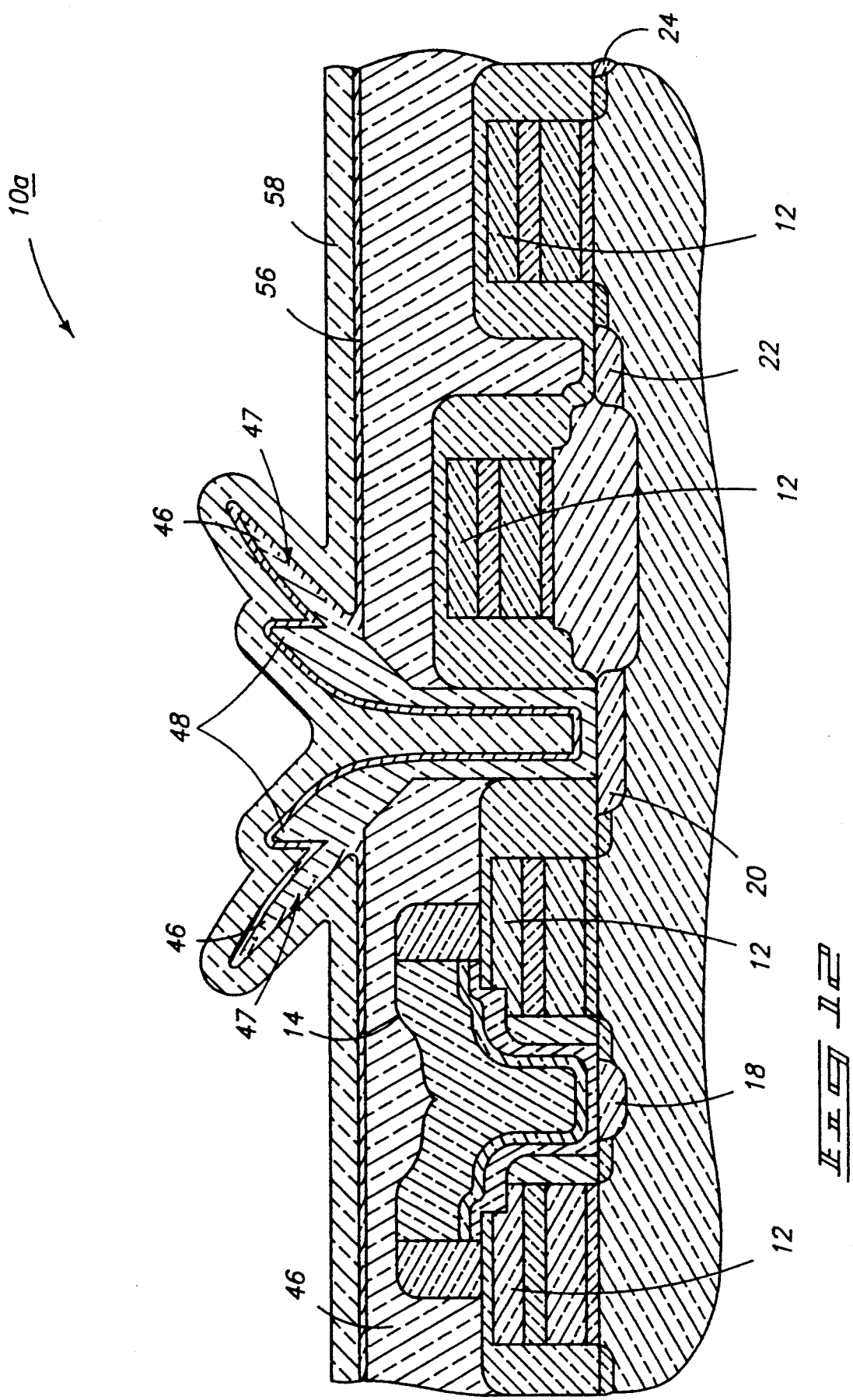
FIG. 12 is a diagrammatic section of the FIG. 10 wafer illustrated at a processing step subsequent to that shown by FIG. 11.

Referring to FIG. 12, a subsequent layer 58 is thereafter deposited to provide the continuous cell polysilicon.

Another alternate embodiment wafer 10B is illustrated by FIG. 13 which further increases capacitance. Here, the difference from the process described with reference to FIGS. 1–9 starts after FIGS. 3 or 4. A trench 80 is etched through second contact opening 40 and through defined active area 20. Wafer 10B would typically be a silicon wafer, with a conventional silicon etch being conducted which is selective to oxide. Therefore, such a silicon etch could be conducted before or after removing the patterned photoresist of FIG. 3. Thereafter, the non-conformal polysilicon deposition, with in situ arsine doping, will extend polysilicon layer 42 downwardly into trench 80 to provide a layer of polysilicon therein which is substantially equal to the first thickness, and thereby incompletely fills trench 80. Such a construction remains in contact remaining portions of active area 20, as shown, and further maximizes area for available capacitance. As well, the in situ doping with arsine will produce out-diffusion areas 81 which effectively increases the volume of active area 20.

In compliance with the statue, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A method of forming a capacitor on a semiconductor wafer comprising the following steps:

providing a layer of insulating dielectric atop the semiconductor wafer to a selected thickness, the insulating layer having an upper surface;

providing a mask layer over the layer of insulating dielectric;

patterning an aperture of a selected diameter through a mask layer for definition of a contact opening through the insulating dielectric layer to a defined area on the wafer;

isotropically etching the insulating dielectric through the aperture to a selected depth which is less than the selected thickness and thereby defining a first contact opening of a selected diameter having non-perpendicular angled ramps extending partially into the layer of insulating dielectric which define a first contact opening base, the selected diameter of the first contact opening at the upper insulating dielectric layer surface being greater than the aperture selected diameter;

anisotropically etching the insulating dielectric through the aperture and first contact opening to the defined area on the wafer thereby defining a second contact opening of a selected diameter extending from the first contact opening base to the defined area on the wafer, the second contact opening diameter being substantially equal to the selected diameter of the aperture;

non-conformally depositing a layer of polysilicon atop the wafer and to within the first and second contact openings, the non-conformal layer incompletely filling the second contact opening and having a first thickness therein, the non-conformal layer having a second thickness over the insulating dielectric layer upper surface which is greater than the first thickness, the non-conformal layer having a third thickness over at least a portion of the angled ramps which is greater than the first and second thickness;

selectively masking polysilicon within the first and second contact openings for definition of a capacitor storage node;

anisotropically etching the masked polysilicon layer to substantially completely remove polysilicon from atop the non-perpendicular insulating dielectric and to leave polysilicon atop the non-perpendicular angled ramp portions to provide non-perpendicularly angled projecting polysilicon portions;

providing a layer of cell dielectric atop the wafer and over polysilicon remaining in the first and second contact openings; and providing a layer of conductive material atop the cell dielectric layer.

2. The method of forming a capacitor of claim 1 wherein the selected thickness of the insulating layer is from about 12,000 Angstroms to about 18,000 Angstroms.

3. The method of forming a capacitor of claim 2 wherein the selected thickness of the insulating layer is about 15,000 Angstroms.

4. The method of forming a capacitor of claim 2 wherein the selected depth is from about 6,000 Angstroms to about 8,000 Angstroms.

5. The method of forming a capacitor of claim 2 wherein the selected depth is about 7,000 Angstroms.

6. The method of forming a capacitor of claim 1 wherein the selected thickness of the insulating layer is about 15,000 Angstroms and the selected depth is about 7,000 Angstroms.

7. The method of forming a capacitor of claim 1 wherein the selected diameter of the first contact is etched to be greater than twice the aperture diameter and correspondingly twice the second contact opening selected diameter.

8. The method of forming a capacitor of claim 1 wherein the selected diameter of the first contact is etched to be greater than twice the aperture diameter and correspondingly twice the second contact opening selected diameter, and the selected depth is from about 6,000 Angstroms to about 8,000 Angstroms.

9. The method of forming a capacitor of claim 1 wherein, the selected thickness of the insulating layer is from about 12,000 Angstroms to about 18,000 Angstroms;

the selected diameter of the first contact is etched to be greater than twice the aperture diameter and correspondingly twice the second contact opening selected diameter; and the selected depth is from about 6,000 Angstroms to about 8,000 Angstroms.

10. The method of forming a capacitor of claim 1 wherein the ratio of the second thickness to the first thickness is from about 5:2 to about 5:1.

11. The method of forming a capacitor of claim 10 wherein the ratio of the second thickness to the first thickness is about 10:3.

12. The method of forming a capacitor of claim 1 wherein, the selected thickness of the insulating layer is from about 12,000 Angstroms to about 18,000 Angstroms;

the selected diameter of the first contact is etched to be greater than twice the aperture diameter and correspondingly twice the second contact opening selected diameter;

the selected depth is from about 6,000 Angstroms to about 8,000 Angstroms; and the ratio of the second thickness to the first thickness is about 10:3.

13. The method of forming a capacitor of claim 1 wherein the step of selectively masking polysilicon within the first and second contact openings comprises providing a mask which is substantially centered over the second contact opening, the mask having a diameter which is greater than the selected diameter of the second contact opening.

14. The method of forming a capacitor of claim 1 further comprising: before the non-conformal deposition, etching a trench through the defined area into the wafer; the subsequent non-conformal polysilicon deposition providing a layer of polysilicon approximately equal to the first thickness in the trench which incompletely fills the trench.

15. A method of forming a capacitor on a semiconductor wafer comprising the following steps:

providing a layer of insulating dielectric atop the semiconductor wafer to a thickness of from about 12,000 Angstroms to about 18,000 Angstroms, the insulating layer having an upper surface;

providing a mask layer over the layer of insulating dielectric;

patterning an aperture of a selected diameter through the mask layer for definition of a contact opening through the insulating dielectric layer to a defined area on the wafer;

isotropically etching the insulating dielectric through the aperture to a selected depth of from about 6,000 Angstroms to about 8,000 Angstroms and thereby defining a first contact opening of a selected diameter having non-perpendicular angled ramps extending partially into the layer of insulating dielectric which define a first contact opening base, the selected diameter of the first contact opening at the upper insulating dielectric layer surface being greater than twice the aperture selected diameter;

anisotropically etching the insulating dielectric through the aperture and first contact opening to the defined area on the wafer thereby defining a second contact opening of a selected diameter extending from the first contact opening base to the defined area on the wafer, the second contact opening diameter being substantially equal to the selected diameter of the aperture;

non-conformally depositing a layer of polysilicon atop the wafer and to within the first and second contact openings, the non-conformal layer incompletely filling the second contact opening and having a first thickness therein, the non-conformal layer having a second thickness over the insulating dielectric layer upper surface which is greater than the first thickness, the non-conformal layer having a third thickness over at least a portion of the angled ramps which is greater than the first and second thickness, the ratio of the second thickness to the first thickness being from about 5:2 to about 5:1;

providing a mask over the polysilicon within the first and second contact openings for definition of a capacitor storage node, the mask being substantially centered over the second contact opening and having a diameter which is greater than the selected diameter of the second contact opening;

anisotropically etching the polysilicon to substantially completely remove polysilicon from atop the upper surface of the insulating dielectric and to leave polysilicon atop the non-perpendicular angled ramp portions to provide non-perpendicularly angled projecting polysilicon portions;

providing a layer of cell dielectric atop the wafer and over polysilicon remaining in the first and second contact openings; and providing a layer of conductive material atop the cell dielectric layer.

16. The method of forming a capacitor of claim 15 further comprising: before the non-conformal deposition, etching a trench through the defined area into the wafer; the subsequent non-conformal polysilicon deposition providing a layer of polysilicon approximately equal to the first thickness in the trench which incompletely fills the trench.

17. A method of forming a capacitor on a semiconductor wafer comprising the following steps:

providing a layer of insulating dielectric atop the semiconductor wafer to a selected thickness, the insulating layer having an upper surface;

providing a mask layer over the layer of insulating dielectric;

patterning an aperture of a selected diameter through the mask layer for definition of a contact opening through the insulating dielectric layer to a defined area on the wafer;

isotropically etching the insulating dielectric through the aperture to a selected depth which is less than the selected thickness and thereby defining a first contact opening of a selected diameter having non-perpendicular angled ramps extending partially into the layer of insulating dielectric which define a first contact opening base, the selected diameter of the first contact opening at the upper insulating dielectric layer surface being greater than the aperture selected diameter;

anisotropically etching the insulating dielectric through the aperture and first contact opening to the defined area on the wafer thereby defining a second contact opening of a selected diameter extending from the first contact opening base to the defined area on the wafer, the second contact opening diameter being substantially equal to the selected diameter of the aperture;

non-conformally depositing a layer of polysilicon atop the wafer and to within the first and second contact openings, the non-conformal layer incompletely filling the second contact opening and having a first thickness therein, the non-conformal layer having a second thickness over the insulating dielectric layer upper surface which is greater than the first thickness, the non-conformal layer having a third thickness over at least a portion of the angled ramps which is greater than the first and second thicknesses;

selectively masking polysilicon within the first and second contact openings for definition of a capacitor storage node;

anisotropically etching the masked polysilicon layer to substantially completely remove polysilicon from atop the upper surface of the insulating dielectric and to leave polysilicon atop the non-perpendicular angled ramp portions to provide non-perpendicularly angled projecting polysilicon portions;

isotropically etching the insulating dielectric from beneath the non-perpendicularly angled projecting polysilicon portions;

providing a conformal layer of cell dielectric atop the wafer and over and beneath polysilicon remaining in the first and second contact openings; and providing a layer of conductive material atop the cell dielectric layer.

18. The method of forming a capacitor of claim 17 wherein the selected thickness of the insulating layer is from about 12,000 Angstroms to about 18,000 Angstroms.

19. The method of forming a capacitor of claim 18 wherein the selected thickness of the insulating layer is about 15,000 Angstroms.

20. The method of forming a capacitor of claim 18 wherein the selected depth is from about 6,000 Angstroms to about 8,000 Angstroms.

21. The method of forming a capacitor of claim 18 wherein the selected depth is about 7,000 Angstroms.

22. The method of forming a capacitor of claim 17 wherein the selected diameter of the first contact is etched to be greater than twice the aperture diameter and correspondingly twice the second contact opening selected diameter.

23. The method of forming a capacitor of claim 17 wherein the selected thickness of the insulating layer is from about 12,000 Angstroms to about 18,000 Angstroms, and the selected diameter of the first contact is etched to be greater than twice the aperture diameter and correspondingly twice the second contact opening selected diameter.

24. The method of forming a capacitor of claim 17 wherein, the selected thickness of the insulating layer is from about 12,000 Angstroms to about 18,000 Angstroms;

the selected diameter of the first contact is etched to be greater than twice the aperture diameter and correspondingly twice the second contact opening selected diameter; and the selected depth is from about 6,000 Angstroms to about 8,000 Angstroms.

25. The method of forming a capacitor of claim 17 wherein the ratio of the second thickness to the first thickness is from about 5:2 to about 5:1.

26. The method of forming a capacitor of claim 25 wherein the ratio of the second thickness to the first thickness is about 10:3.

27. The method of forming a capacitor of claim 17 wherein the step of selectively masking polysilicon within the first and second contact openings comprises providing a mask which is substantially centered over the second contact opening, the mask having a diameter which is greater than the selected diameter of the second contact opening.

28. The method of forming a capacitor of claim 17 wherein, the selected thickness of the insulating layer is from about 12,000 Angstroms to about 18,000 Angstroms;

the selected diameter of the first contact is etched to be greater than twice the aperture diameter and correspondingly twice the second contact opening selected diameter;

the selected depth is from about 6,000 Angstroms to about 8,000 Angstroms;

the step of selectively masking polysilicon within the first and second contact openings comprises providing a mask which is substantially centered over the second contact opening, the mask having a diameter which is greater than the selected diameter of the second contact opening.

29. The method of forming a capacitor of claim 17 further comprising: before the non-conformal deposition, etching a trench through the defined area into the wafer; the subsequent non-conformal polysilicon deposition providing a layer of polysilicon approximately equal to the first thickness in the trench which incompletely fills the trench.

* * * * *